United States Patent
Krishnakumar et al.

(10) Patent No.: US 10,176,982 B2
(45) Date of Patent: Jan. 8, 2019

(54) METHOD FOR FORMING A GRADIENT THIN FILM BY SPRAY PYROLYSIS

(71) Applicants: CHINA TRIUMPH INTERNATIONAL ENGINEERING CO., LTD., Shanghai (CN); CTF SOLAR GMBH, Dresden (DE)

(72) Inventors: Velappan Krishnakumar, Dresden (DE); Harr Michael, Dresden (DE)

(73) Assignees: CHINA TRIUMPH INTERNATIONAL ENGINEERING CO., LTD., Putuo District, Shanghai (CN); CTF SOLAR GMBH, Dresden (DE)

( * ) Notice: Subject to any disclaimer, the term of this patent is extended or adjusted under 35 U.S.C. 154(b) by 0 days.

(21) Appl. No.: 15/541,251

(22) PCT Filed: Dec. 15, 2015

(86) PCT No.: PCT/CN2015/097335
§ 371 (c)(1),
(2) Date: Jun. 30, 2017

(87) PCT Pub. No.: WO2016/095786
PCT Pub. Date: Jun. 23, 2016

(65) Prior Publication Data
US 2017/0309477 A1 Oct. 26, 2017

(30) Foreign Application Priority Data
Dec. 15, 2014 (DE) .......................... 10 2014 225 862

(51) Int. Cl.
*H01L 21/02* (2006.01)
*H01L 31/0224* (2006.01)
(Continued)

(52) U.S. Cl.
CPC ........ *H01L 21/02255* (2013.01); *C23C 22/76* (2013.01); *H01L 31/0296* (2013.01);
(Continued)

(58) Field of Classification Search
None
See application file for complete search history.

(56) References Cited

U.S. PATENT DOCUMENTS

| | | | | |
|---|---|---|---|---|
| 2010/0261304 | A1* | 10/2010 | Chang | C23C 18/06 438/72 |
| 2012/0060900 | A1* | 3/2012 | Kodenkandath | H01L 31/0322 136/249 |
| 2013/0109124 | A1* | 5/2013 | Peng | C23C 14/086 438/58 |

FOREIGN PATENT DOCUMENTS

| | | |
|---|---|---|
| CN | 102130207 A | 7/2011 |
| CN | CN 102142475 A | 8/2011 |

(Continued)

*Primary Examiner* — Nathan T Leong
(74) *Attorney, Agent, or Firm* — Global IP Services; Tianhua Gu (57) ABSTRACT

The present invention proposes a method to form a gradient thin film using a spray pyrolysis technique. The method comprises providing a base substrate, preparing a spray aqueous solution by mixing at least two precursor compounds comprising at least two different elements and spraying the spray aqueous solution onto the base substrate. According to the present invention, the ratio of the concentration of the at least two different elements within the spray aqueous solution is varied while performing the method. In this way, a thin film having a gradient of elemental composition over its layer thickness may be formed.

20 Claims, 4 Drawing Sheets (51) Int. Cl.
*H01L 31/073* (2012.01)
*H01L 31/18* (2006.01)
*C23C 22/76* (2006.01)
*H01L 31/0296* (2006.01)

(52) U.S. Cl.
CPC ............... *H01L 31/022425* (2013.01); *H01L 31/022466* (2013.01); *H01L 31/073* (2013.01); *H01L 31/1836* (2013.01); *H01L 31/1884* (2013.01); *Y02E 10/543* (2013.01)

(56) References Cited

FOREIGN PATENT DOCUMENTS

| | | |
|---|---|---|
| CN | CN 102456754 A | 5/2012 |
| CN | 104183663 A | 12/2014 |
| JP | 2014040331 A | 3/2014 |

* cited by examiner

METHOD FOR FORMING A GRADIENT THIN FILM BY SPRAY PYROLYSIS

CROSS REFERENCE TO RELATED PATENT APPLICATION

The present application is the US national stage of PCT/CN2015/097335 filed on Dec. 15, 2015, which claims the priority of DE 102014225862.6 filed on Dec. 15, 2014, which applications are incorporated herein by reference.

TECHNICAL FIELD

The objective of the present invention is a method for forming a gradient thin film by spray pyrolysis. This method is preferably used for forming a transparent bi-layer film as front contact in a CdTe solar cell.

BACKGROUND

In the state of the art, the CdTe solar cell has the following structure, wherein the layers are arranged in the mentioned sequence: a transparent substrate, for instance made of glass; a transparent conducting oxide layer (TCO) formed as front contact; a layer of cadmium sulfide (CdS); a layer of cadmium telluride (CdTe); and a metal layer to collect the charge carriers.

In producing the solar cells in the so called superstrate configuration, the transparent substrate forms the base on which the subsequent layers are deposited one after another. In the production process of solar cells in the so called substrate configuration, the steps of forming the individual layers are performed basically in a reverse order. That is, the process starts with forming a back contact on a suitable substrate or with providing the back contact in form of a substrate, for instance as a flexible metal foil such as molybdenum, on which the subsequent layers are deposited one after another.

The transparent conducting oxide layer (TCO) advantageously comprises a high resistive transparent buffer layer. The use of the high resistive buffer layer is very important, since this buffer layer helps to minimize the shunting effect in the solar cell. Thus, this layer increases performance, reliability and reproducibility of the produced solar cells.

It has been proved that cadmium stannate (CTO) is an optimal conducting material for CdTe solar cells and zinc stannate (ZTO) is the suitable high resistive buffer layer partner.

Many research work from the literature show that the formation of stoichiometric and polycrystalline CTO film is a difficult issue. In general, the CTO layer needs very high temperature in order to obtain crystalline phases. Moreover according to the state of art, the CTO layer has cadmium deficiency independent of deposition methods. In case of CTO layer preparation by sputtering, the formed film is amorphous in general and has to be annealed in a temperature range up to 600° C. for forming a crystalline film. Therefore, the material to be used as substrate is very limited. In particular, cost efficient soda lime glasses cannot be used as substrate, since it is not resistant to elevated temperatures.

From "CdS/CdTe thin-film solar cell with a zinc stannate buffer layer" (Wu et al., Photovoltaic program review meeting, Denver/Colo., Sep. 8-11, 1998) it is known that zinc stannate films ($Zn_2SnO_4$ or ZTO) are suited as a buffer layer, since they have a high bandgap, high transmittance, and low surface roughness.

Another method for forming stannate thin films is the spray pyrolysis technique. For instance, "Preparation of cadmium stannate films by spray pyrolysis technique" (Krishnakumar et al., Current Applied Physics 9, 2009, p. 467-471) describes this method for forming a CTO layer at relatively low substrate temperature (500° C.). However, the weight ratio of the tin and cadmium compound precursors dissolved in the spray solvent were not changed during the formation of the CTO film. Therefore, the resulting CTO film has an essentially constant elemental concentration over the thickness of the layer.

SUMMARY

The object of the present invention is to provide a method for preparing a gradient thin film by spray pyrolysis which includes many advantages. That is, a thin film having a gradient of elemental composition over its layer thickness should be formed. In particular, this invention regards formation of gradient conducting layer and/or gradient buffer layer. One of the advantages in forming gradient CTO and ZTO layers include smooth band offset at the CTO/ZTO/CdS interfaces. The other benefits are described in the following text.

According to the invention, the method for forming a gradient thin film comprises a step a) of providing a base substrate, a step b) of preparing a spray aqueous solution by mixing at least two precursor compounds comprising at least two different elements, and a step c) of spraying the spray aqueous solution onto the base substrate. A pyrolysis of at least one of the at least two precursor compounds and a reaction of the resulting ions with each other or with the other precursor compounds takes place after the spray aqueous solution is sprayed onto the base substrate. The term "base substrate" describes any suitable layer, layer stack or substrate onto which the spray aqueous solution is sprayed and corresponds to the process, of which the inventive method is a part. Furthermore, the base substrate may be arranged on other layers or on a substrate. Preferably, the inventive method is used in a process for manufacturing a CdTe solar cell. In this case, the base substrate may be, for instance, a glass substrate, a transparent conducting layer, a high resistive buffer layer or a CdS layer depending on the configuration in which the solar cell is formed.

While performing the method, the ratio of the concentration of the at least two different elements within the spray aqueous solution is varied. Thus, a thin film having a gradient of elemental composition over its layer thickness is formed. In other words: A concentration gradient of at least one element may be formed within the thin layer. In this way, the elemental concentration at the interfaces of the thin film to the respective adjacent layers, e.g. the base substrate, and the properties of these interfaces may be adjusted to advantageous values and properties.

Preferably the ratio of the concentration of the at least two different elements, i.e. the ratio of the concentration of atoms of a first element to the concentration of the atoms of a second element, within the spray aqueous solution is set to be, for instance, in a range from 1 to 50. By adjusting the concentration of the at least two different elements, the properties of the formed thin film, e.g. the transmittance and the electrical conductivity of the thin film, can be set to pre-determined values. Such increased elemental quantity can also help to overcome the Cd deficiency in the CTO layer.

The spraying step may be performed in a pulsed way, i.e. spraying the spray aqueous solution on the base substrate for 1 s to 20 s, preferably 2 s to 5 s, waiting for 10 s to 40 s to perform pyrolysis and forming a stable film and repeating this steps several times. As a matter of course, the "base substrate" onto which the spray aqueous solution is sprayed is actually the base substrate with a partial thin film on it for each step following the first waiting step. The carrier gas can also be any suitable gas depending on the film requirement. In case, if it is intended to have less oxides/oxygen in the film, then the carrier gas, for instance can be nitrogen or inert gas and/or the spraying atmosphere can also be oxygen reduced atmosphere or inert atmosphere. The carrier gas for spraying is preferably air and the spraying atmosphere, i.e. the atmosphere in which the method is performed, is also preferably air at normal conditions.

Preferably, the method is performed while the base substrate is held at a temperature in a range from 300° C. to 600° C., more preferably in a range from 450° C. to 500° C., depending on precursor material selection. The available thermal energy enables the pyrolysis of the precursor compounds in the spray aqueous solution and helps to form the thin film on the base substrate. That is, before spraying the spray aqueous solution onto the base substrate, the base substrate is heated to the mentioned temperature. However, the base substrate may already be on this temperature, if other process steps, for instance forming a CdS layer or a transparent conducting layer, are performed directly or almost directly before spraying the spray aqueous solution onto the base substrate.

An appropriate solvent can be used depending on the precursor compound compositions. The precursor materials can be chemical derivatives of Cd in case of CTO and can be chemical derivatives of Zn in case of ZTO. For instance, the solvent can be water in case of using an acetate precursor compound. Further additives may be used to adjust the properties of the spray aqueous solution and/or of the formed thin film. As an example, if a ZTO layer or a CTO layer is formed as the thin film using a zinc acetate ($Zn(CH_3COO)_2$) or a cadmium acetate ($Cd(CH_3COO)_2$), respectively, as one of the precursor compounds preferably hydrochloric acid (HCl) is added to the spray aqueous solution in order to obtain a transparent solution. The HCl is added until the solution turns into transparent. The amount of the HCl depends on the ratio of the precursor compounds in the solution and may vary, for instance, in a range from 0.5% to 10%, more preferably in a range from 1% to 3%, of the total volume of the prepared spray aqueous solution.

The resulting thin film prepared with the inventive method is preferably formed with a thickness in a range from 20 nm to 1000 nm and more preferably in the range of 300 to 500 nm. The structural phase of the formed thin layer can be amorphous or crystalline or a mixture of different phases depending on the temperature of the base substrate and the spraying parameters during the performance of the method.

The varying ratio of the concentration of the at least two different elements within the spray aqueous solution may be achieved by adding one of the at least two precursor compounds continuously to the spray aqueous solution while performing the inventive method. That is, the spray aqueous solution is permanently mixed in a reservoir, e.g. a tank, from which the spray aqueous solution is permanently taken and sprayed onto the base substrate. In the result, a thin film having a continuously changing element concentration is formed.

In another preferred embodiment, different spray aqueous solutions, each having a specific ratio of the concentration of the at least two different elements within the spray aqueous solution, are prepared, preferably in different reservoirs. Thus, the different spray aqueous solutions may preferably be prepared in parallel and be used whenever a thin film having a specific ratio of the elemental concentration corresponding to the specific ratio of the concentration of the at least two different elements in the specific spray aqueous solution should be formed. However, the different spray aqueous solutions having different ratios of the concentration of the at least two different elements may also be prepared by adding one of the precursor compounds from time to time to the solution and mixing the solution in one and the same reservoir.

In other words: In this preferred embodiment of the method used for forming an elemental concentration gradient within the formed thin layer, step b), i.e. preparing a spray aqueous solution, comprises at least two substeps b1) and b2), wherein in each of these substeps b1) and b2) a specific spray aqueous solution having a specific ratio of the concentration of the at least two different elements is prepared by mixing the at least two precursor compounds, and step c), i.e. spraying the solution onto the base substrate, comprises at least two substeps c1) and c2) each of them corresponding to one of the at least two substeps b1) and b2), wherein in each of these substeps c1) and c2) the specific spray aqueous solution prepared in the specific corresponding substep b1) or b2) is sprayed onto the base substrate or onto the thin film formed in the previous substep of step c). The at least two substeps b1) and b2) may be performed simultaneously or successively, whereas the at least two substeps c1) and c2) are performed subsequently to the corresponding one of the at least two substeps b1) and b2) and one after another.

In the result, the thin film layer resulting after terminating this preferred embodiment of the method comprises at least two different partial thin films having different concentrations of the at least two different elements, which are essentially uniform within a specific partial thin film. That is, the elemental concentration gradually changes within the resulting thin film.

Preferably, each of these partial thin films is applied with a thickness in a range of 10 nm to 50 nm, preferably in a range from 20 nm to 40 nm. The thickness of the partial thin films can be different for different partial thin film and may vary depending on the number of the partial thin films, which helps to form the elemental concentration gradient within the overall thin film.

Preferably, a time in a range from 20 s to 40 s is set between the end of a specific substep of step c) and the beginning of a subsequent substep of step c).

Preferably, the inventive method is used in a process for manufacturing a CdTe solar cell, wherein a gradient in CTO and/or ZTO on top of CTO layer with gradual increase or decrease of Cd or Zn within the layer is intended. In case of CTO it is preferable to have gradual decrease of Cd-concentration from glass side to buffer layer side, for instance from Cd/Sn ratio 20:1 to 2:1 and the minimum stoichiometric ratio is 2:1. The mentioned ratio values are in the precursor solution. In case of ZTO layer it is preferable to increase Zn from slightly less Zn/Sn stoichiometric ratio at the CTO junction to higher Zn content at CdS layer interface. Such interface with varying elemental concentration is beneficial to minimize the lattice mismatch between the interface layers and thereby the electronic interface states at the interface can also be minimized through elemental inter-diffusion process. Advantage in having excess Zn content is explained in the following text.

Similarly gradual variation of Cd concentration within CdS layer is also beneficial. For example reduced Cd at ZTO/CdS layer interface would lead to beneficial Zn diffusion into CdS layer which would increase the transmittance of CdS layer and thereby can help to increase the short circuit current of the solar cell and can yield increased device efficiency. The process of making gradient CdS layer is not described since the layer formation principle is same as for gradient conducting layer.

One could realize that the elemental gradient in conducting layer, buffer layer and CdS layers can be made for all the layers in one solar cell or it can be also selected either one of the layer gradient variation by keeping other layer elemental concentration as constant, depending on the requirement.

This invention of forming a gradient film with varying elemental concentration can also be realized in other thin film solar cell types, for instance copper gallium indium selenide (CIGS). It can also be applied to thin film light emitting diodes.

If the inventive method is used for forming a ZTO layer as a high resistive buffer layer of a CdTe solar cell, the precursor compounds are a Zn containing compound and a Sn containing compound. The Zn containing compound is preferably Zn-acetate ($Zn(CH_3COO)_2$), but may also be $ZnCl_2$, for instance. The Sn containing compound is preferably $SnCl_2$, but may also be $SnCl_4$, for instance. Under "zinc stannate (ZTO)" there should be understood an amorphous phase, $ZnSnO_3$ or $Zn_2SnO_4$, or a mixture of these different phases. If the solar cell is manufactured in the substrate configuration, the base substrate is the CdS layer of the solar cell and is formed on a layer stack comprising at least the CdTe layer and the back contact. In this case the method further comprises forming a transparent conducting layer on the ZTO layer. If the solar cell is manufactured in the superstrate configuration, the base substrate is the transparent conducting layer formed on a transparent substrate and the method further comprises forming a CdS layer on the ZTO layer. Further layers, e.g. a CdTe layer and a back contact, are subsequently formed on the CdS layer. In both methods, any suitable transparent conducting layer, for instance CTO or FTO ($SnO_2$:F), may be used.

The steps for forming the ZTO layer are performed such that the zinc concentration in the resulting ZTO layer decreases over the whole ZTO layer from the interface of the ZTO layer to the CdS layer in the direction to the interface of the ZTO layer to the transparent conducting layer. A high zinc concentration at the interface of the ZTO layer to the CdS layer allows zinc atoms or zinc ions to diffuse from the ZTO layer into the CdS layer thereby improving the optical and electronic characteristics of the CdS layer and to have optimum band alignment thereby interface states (recombination centers) can also be minimized. On the other hand, a low zinc concentration at the interface of the ZTO layer to the transparent conducting layer helps to minimize the lattice mismatch with the transparent conducting layer. The subsequent solar cell preparation includes several steps which involve heating up the substrate, therefore, Zn can diffuse in CdS layer. Due to this outdiffusion of zinc atoms or zinc ions into the CdS layer and to diffusion within the ZTO layer, the gradient of the zinc concentration will essentially be balanced within the ZTO layer over time. Therefore, the gradient of zinc concentration can be seen best directly after forming the ZTO layer. In the completed solar cell, the ZTO layer might have uniform concentration of the elements within the layer.

According to one preferred embodiment, the transparent conducting layer is CTO. This layer is preferably also formed by spray pyrolysis of a spray aqueous solution comprising a Cd containing compound and a Sn containing compound. Preferably, the CTO is formed with the inventive method as described below. However, any other transparent conducting layer according to the state of the art, like $SnO_2$:F for example, can be used instead of CTO.

The ZTO layer is preferably formed with a thickness in the range from 20 nm to 150 nm, more preferably in a range from 80 nm to 100 nm.

If the inventive method is used for forming a CTO layer as a transparent conductive layer of a CdTe solar cell, the precursor compounds are a Cd containing compound and a Sn containing compound. The Cd containing compound is preferably Cd-acetate ($Cd(CH_3COO)_2$), but may also be $CdCl_2$, for instance. The Sn containing compound is preferably $SnCl_2$, but may also be $SnCl_4$, for instance. The "cadmium stannate (CTO)" might contain an amorphous phase, $CdSnO_3$ or $Cd_2SnO_4$, or a mixture of these different phases. If the solar cell is manufactured in the substrate configuration, the base substrate is the high resistive buffer layer of the solar cell and is formed on a layer stack comprising at least the CdS layer, the CdTe layer and the back contact. In this case the method further comprises forming a transparent cover layer on the CTO layer. If the solar cell is manufactured in the superstrate configuration, the base substrate is the transparent substrate and the method further comprises forming a high resistive buffer layer on the CTO layer. Further layers, e.g. a CdS layer, a CdTe layer and a back contact, are subsequently formed on the high resistive buffer layer.

The steps for forming the CTO layer are performed such that the cadmium concentration in the resulting CTO layer increases over the whole CTO layer from the interface of the CTO layer to the transparent cover layer or the transparent substrate, respectively, in the direction to the interface of the CTO layer to the high resistive buffer layer. Due to diffusion within the CTO layer caused, for instance, during the coating process and/or by subsequent post solar cell preparation processes including high temperatures, the gradient of the cadmium concentration will essentially be balanced within the CTO layer over time. The gradient in elemental concentration in the deposited layer can be identified using known analytical tools for instance secondary ion mass spectrometry or X-ray photoelectron spectroscopy depth profiling techniques. It can also be possible that depending on the further solar cell preparation steps for instance, if the next successive steps involve high temperature process >600° C., in such case the concentration gradient within the spray coated film might vanish due to the beneficial interdiffusion process within and/or between the layers. Therefore, the gradient of cadmium concentration can be seen best directly after forming the CTO layer. In the completed solar cell, the CTO layer might have uniform concentration of the elements within the layer.

Further, the Cd-concentration is heavily increased in the spray aqueous solution in order to compensate Cd-deficiency due to re-evaporation during formation of the CTO layer at temperatures of 450° C. or higher. Additionally, the high cadmium-concentration in the spray aqueous solution is also motivated to increase the Cd concentration in the film. In case of CTO spray deposition using cadmium acetate as precursor the substrate temperature can be below 510° C. in order to get ternary compound and in case of $CdCl_2$ as starting precursor material one might need very high substrate temperature as reported in the literature.

According to one preferred embodiment, the high resistive buffer layer is ZTO. This layer is preferably also formed by spray pyrolysis of a spray aqueous solution comprising a Zn containing compound and a Sn containing compound. Preferably, the ZTO is formed with the inventive method as described above. However, any other high resistive buffer layer according to the state of the art can be used instead of ZTO. In case of superstrate solar cell structure, the ZTO layer can be deposited at low substrate temperature in the range of 250° C. to 500° C., more preferably in the range of 300° C. to 400° C.

The CTO layer is preferably formed with a thickness in the range from 100 nm to 1000 nm, preferably in the range from 300 nm to 500 nm and has a high electrical conductivity.

The process steps of providing or forming the other layers of a solar cell, including also $CdCl_2$ annealing and back contact processes, may be performed according to well-known methods from prior art and are therefore not described in detail herein.

The formation of gradient layer can also be realized in other deposition techniques, for instance, in case of sputter deposition, multiple sputtering targets with varying elemental concentration within the sputtering target can be implemented. In such case the base material can pass through different sputtering chambers in order to have gradient layer. Such alternative gradient layer deposition method can also be realized by any other techniques, for instance, but not limited to chemical vapor deposition, close-spaced sublimation technique etc.

BRIEF DESCRIPTION OF THE DRAWINGS

FIGS. 2A and 2B schematically show the process steps of the inventive method for forming a gradient thin film, wherein FIG. 2A shows the process steps for a continuous change of the elemental concentration and FIG. 2B shows the process steps for a gradual change of the elemental concentration.

DETAILED DESCRIPTION

The method according to the invention is explained with respect to the following figures by way of example. The shown and described details are only for the purpose of better understanding and are in no way limiting with respect to the scope of the claims.

Figure 2A:
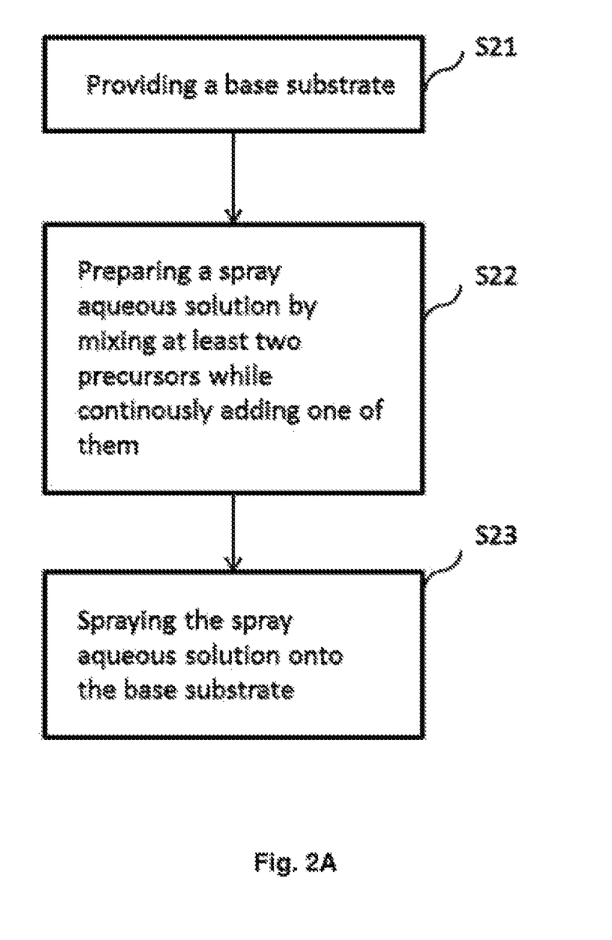

An embodiment of the inventive method comprises steps S21 to S23 as shown in FIG. 2A. In step S21, a base substrate is provided. This base substrate is for instance the transparent conducting layer (21) arranged on the transparent substrate (1). In this exemplary embodiment the base substrate is commercial $SnO_2$:F. However, it can be also considered that instead of FTO, CTO can also be deposited by spray pyrolysis with variation in elemental concentration during the coating based on the similar procedure as described for the ZTO. The base substrate is heated to a temperature of 480° C. to enable a pyrolysis of the precursor compounds. In step S22, a spray aqueous solution is prepared by mixing at least two precursor compounds, for instance $Zn(CH_3COO)_2.H_2O$ and $SnCl_2.H_2O$, comprising at least two different elements, being Zn and Sn in the described example. Furthermore, 1 ml of hydrochloric acid is added to 100 ml of the spray aqeos solution. In step S23, the spray aqueous solution is sprayed onto the base substrate, where the pyrolysis of the $Zn(CH_3COO)_2$ and a reaction take place resulting in the formation of a ZTO layer. Step S23 actually consists of a sequence of spraying the spray aqueous solution on the base substrate for around 2 s and of waiting for 30 s for performing pyrolysis and forming a stable ZTO film, whereas this sequence is repeated several times. The time duration of the whole method is calculated based on the growth rate and the desired film thickness. As an example, an about 100 nm ZTO layer can be made in about 30 min of spray coating, based on the spraying conditions mentioned above.

During step S22, one of the at least two precursor compounds is continuously added to the spray aqueous solution while performing the method. That is, the spray aqueous solution is permanently mixed in a reservoir, from which the spray aqueous solution is permanently taken and sprayed onto the base substrate in step S23. In the beginning, the spray aqueous solution has a first ratio for the Zn/Sn concentration, e.g. of 1:1. By adding $Zn(CH_3COO)_2.H_2O$ continuously to the spray aqueous solution, the ratio continuously increases, for instance to a value of 6:1 at the end of the method. By this method, the formed ZTO film has a gradient of the concentration of Zn over its thickness, wherein the concentration changes continuously.

Figure 2B:
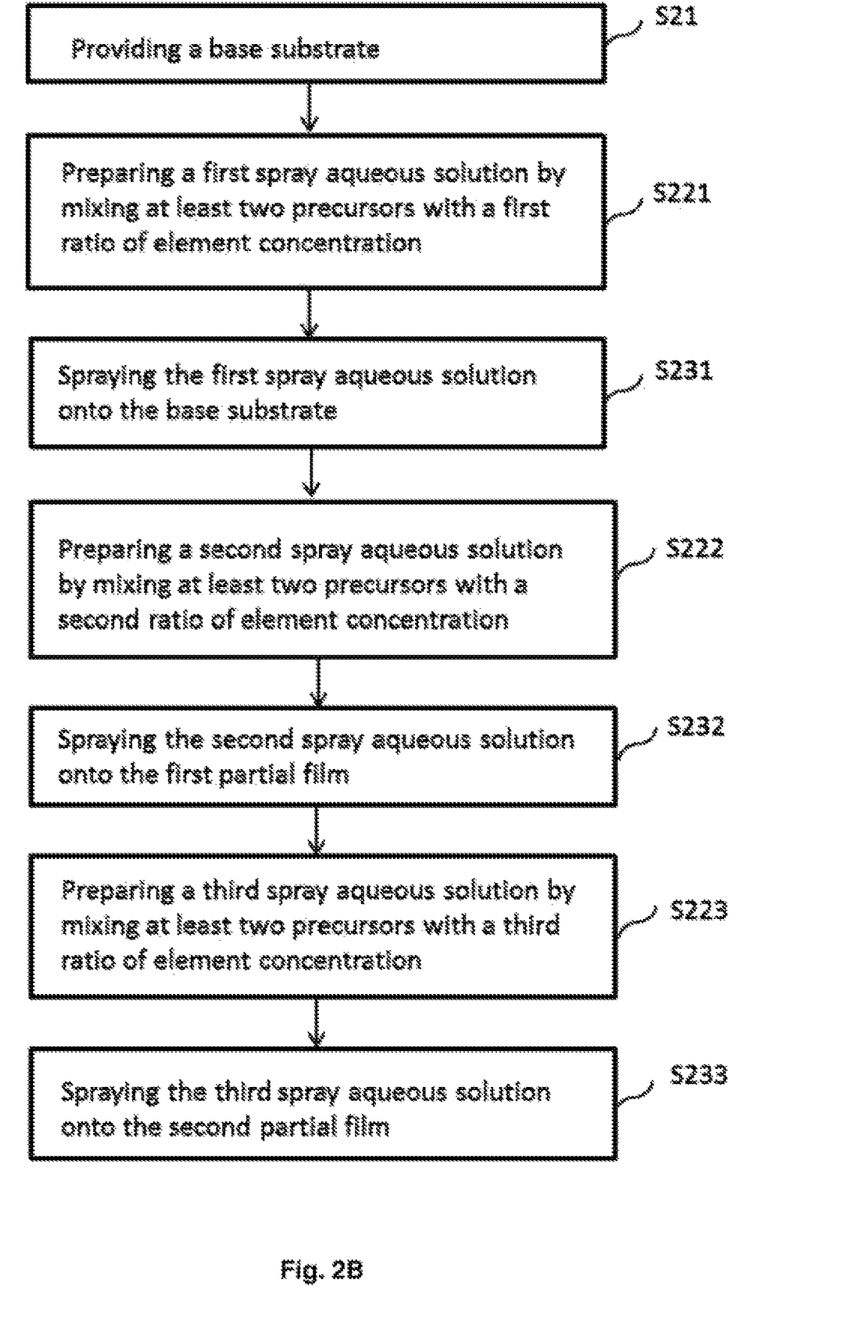

FIG. 2B shows another embodiment of the inventive method. The step S21 is the same as in the embodiment described in FIG. 2A. However, steps S22 and S23 are each divided into at least two substeps, for instance into three substeps, i.e. S221, S222 and S223 and S231, S232 and S233. The numbers of substeps of step S22 and of step S23 equal each other. In each substep S221, S222 and S223, a spray aqueous solution having a constant ratio of the concentration of the two elements, for instance Zn and Sn, is prepared by mixing the at least two precursor compounds, for instance $Zn(CH_3COO)_2.H_2O$ and $SnCl_2.H_2O$, wherein the concentration ratio of the spray aqueous solution prepared in substep S221 is smaller than that of the spray aqueous solution prepared in substep S222, which is smaller than that of the spray aqueous solution prepared in substep S223. For instance, the first ratio is 1:1, the second ratio is 2:1 and the third ratio is 4:1. In each substep S231, S232 and S233, the respective spray aqueous solution prepared in the corresponding substep S221, S222 or S223, respectively, is sprayed onto the base substrate or onto the partial thin film formed in the substep S231 or S232, respectively. Each substep S231, S232 and S233 is a sequence of spraying and waiting as described with respect to step S23 in FIG. 2A. By this method, the formed ZTO film comprises three partial ZTO films each having a different Zn concentration. That is, the ZTO film as a whole has a gradient of the concentration of Zn over its thickness, wherein the concentration changes gradually. The number of substeps of steps S22 and S23 and thereby the number of partial layers is not limited to three, as described with respect to FIG. 2B, but may be two or more than three.

At least substep S221 may be performed in any order with respect to step S21. Furthermore, some of or all of the substeps S221, S222 and S223 may be performed in any order with respect to each other, for instance in parallel to each other, in case that different reservoirs are used for mixing the different spray aqueous solutions. However, it is also possible to use only one reservoir. In this case, substep S222 has to be performed after completing the substep S231, and substep S223 has to be performed after completing the substep S232.

As described above, the process may be further continued in order to have multiple layers with different layer concentration. Furthermore, both methods according to the embodiments of FIG. 2A and of FIG. 2B may be followed by similar process steps using different kinds of precursor materials thereby forming different kinds of gradient films above each other. For instance a gradient CTO film may be formed followed by a gradient ZTO film which is followed by a gradient CdS film. For each method for forming a gradient film, the appropriate method according to the embodiment of FIG. 2A or of FIG. 2B may be used.

With respect to FIGS. 3A to 3D, the making of a ZTO buffer layer for a solar cell in superstrate configuration according to the method of FIG. 2B is described, without intending to imply a restriction to said embodiment. In particular, the method of forming a ZTO film is not limited to the use in processes for manufacturing a solar cell, but can also be used in processes for manufacturing any other device, e.g. a light emitting device or a sensor.

Figure 3A:
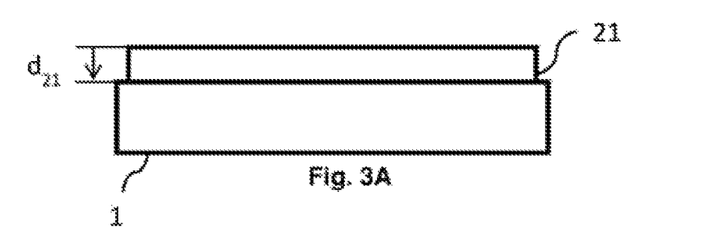
FIG. 3A to 3D schematically shows the layer sequences, as they may be observed during the course of the method as described with respect to FIG. 2B, wherein the ZTO layer (22) is formed with a gradient of the zinc concentration and comprises a plurality of partial ZTO layers (221 to 223).

As shown in FIG. 3A, the transparent conducting layer (21) has already been applied on the transparent substrate (1) by means of methods according to the state of the art. The transparent conducting layer (21) is, for instance, a Fluorine doped tin oxide having a thickness $d_{21}$ of 350 nm.

Figure 3B:
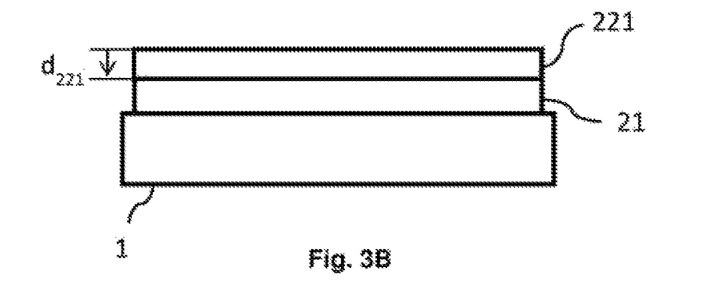

FIG. 3B schematically shows an applied first partial ZTO layer (221) above the transparent conducting layer (21). The first partial ZTO layer (221) has a ratio of 1:1 of the Zn/Sn concentration and was deposited with a thickness $d_{221}$ of 40 nm during substep S231 of the method described in FIG. 2B using a first spray aqueous solution with a corresponding first ratio of the Zn/Sn concentration.

Figure 3C:
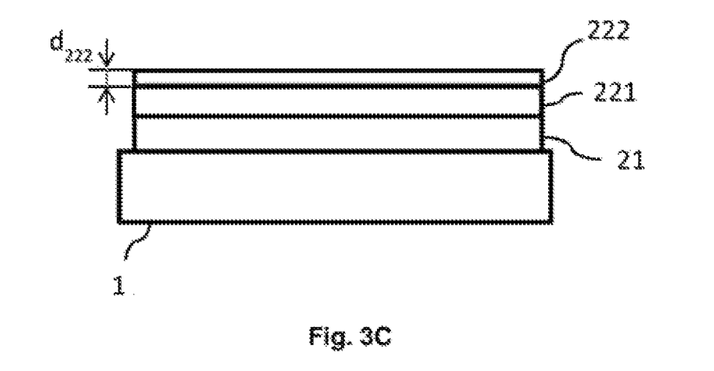

FIG. 3C schematically shows the layer stack after depositing a second partial ZTO layer (222) on the applied first partial ZTO layer (221). The second partial ZTO layer (222) has a ratio of 2:1 of the Zn/Sn concentration and was deposited with a thickness $d_{222}$ of 20 nm during substep S232 of the method described in FIG. 2B using a second spray aqueous solution with a corresponding second ratio of the Zn/Sn concentration.

Figure 3D:
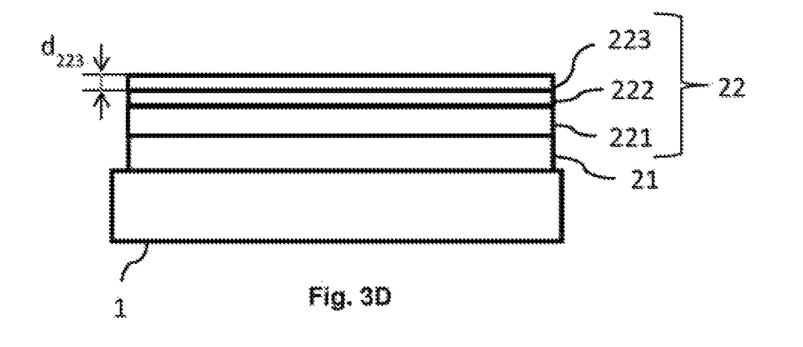

FIG. 3D schematically shows the layer stack after depositing a third partial ZTO layer (223) on the applied second partial ZTO layer (222). The third partial ZTO layer (223) has a ratio of 4:1 of the Zn/Sn concentration and was deposited with a thickness $d_{223}$ of 20 nm during substep S233 of the method described in FIG. 2B using a third spray aqueous solution with a corresponding third ratio of the Zn/Sn concentration.

Figure 1:
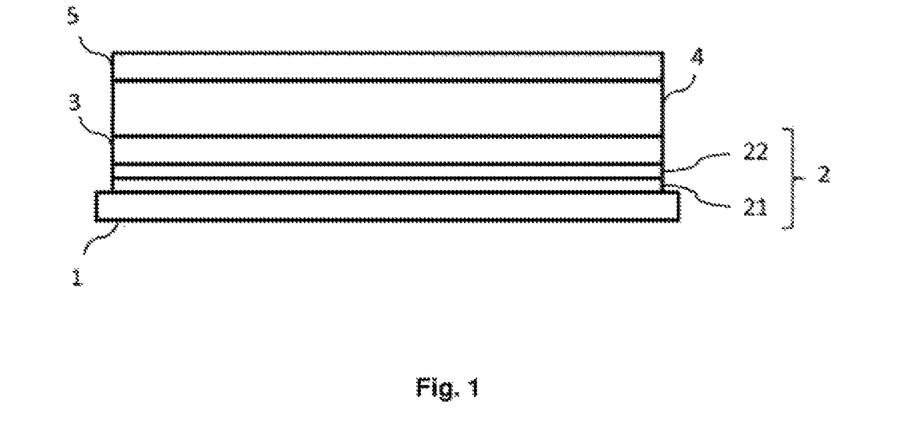
FIG. 1 schematically shows the layer structure of a solar cell according to the state of the art. Said solar cell comprises on a transparent substrate (1) a layer sequence consisting of front contact (2), CdS layer (3), CdTe layer (4) and back contact (5). The front contact (2), also called transparent conducting oxide layer (TCO), comprises a transparent conducting layer (21), made for instance of CTO, and a high resistive buffer layer (22), made for instance of ZTO.

The first, second and third partial ZTO layers (221, 222, 223) together form the ZTO layer (22) similar to that shown in FIG. 1. However, the ZTO layer (22) has a gradient of the zinc concentration in contrast to the state of the art ZTO layer. The zinc concentration gradually increases from the first partial ZTO layer (221) to the third partial ZTO layer (223). The total thikness of the ZTO layer is about 100 nm.

As mentioned above, the number of partial layers is not limited to that of the described example. Furthermore, also the thicknesses and/or the ratios of the Zn/Sn concentration of the specific partial ZTO layers (221, 222, 223) may be changed and adapted to the desired conditions. For instance, a further process step for depositing a fourth partial ZTO layer on the applied third partial ZTO layer may be performed, wherein the fourth partial ZTO layer has a ratio of 6:1 of the Zn/Sn concentration and a thickness of 20 nm.

Subsequently, known process steps for forming the CdS layer (3), the CdTe layer (4) and the back contact layer (5) as shown in FIG. 1 are performed. During and/or after these process steps, zinc atoms or zinc ions diffuse from the third partial ZTO layer (223) into the CdS layer (3).

Furthermore, zinc atoms or zinc ions diffuse within and between the first, second and third partial ZTO layers (221, 222, 223), thereby balancing the zinc concentration within the ZTO layer (22). Thus, the originally generated gradient in zinc concentration essentially vanishes over the time.

Figure 4:
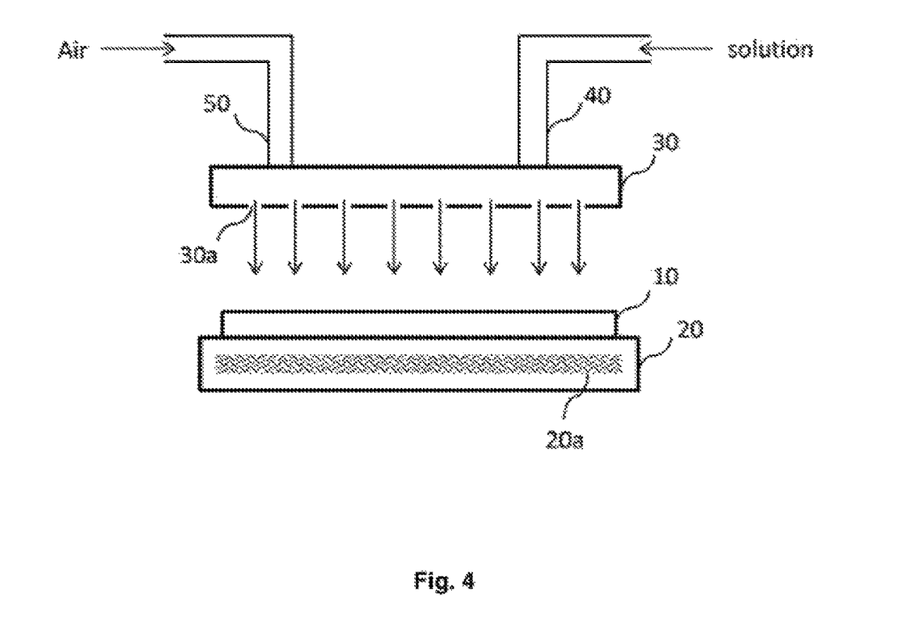
FIG. 4 schematically shows an apparatus for performing the spray pyrolysis according to the inventive method.

FIG. 4 shows schematically an exemplary apparatus for performing the inventive method. A substrate 10 is arranged on a substrate holder 20. The substrate 10 comprises the base substrate described with respect to FIGS. 2A and 2B, which is arranged on that side of the substrate 10 not being adjacent to the substrate holder 20. The substrate holder 20 comprises a heating element 20a for bringing the substrate 10 to the process temperature mentioned with respect to FIG. 2. In other embodiments, the apparatus for performing the inventive method may comprise other means for heating the substrate 10, wherein these means may not be comprised by the substrate holder. Further, the apparatus for performing the inventive method includes a spray nozzle arrangement 30 comprising a plurality of spray nozzles 30a. In other embodiments, the spray nozzle arrangement 30 may comprise only one nozzle 30a. Through the spray nozzles 30a, the spray aqueous solution, which is provided to the spray nozzle arrangement 30 through the solution inlet 40, is sprayed onto the base substrate on top of the substrate 10 (indicated by arrows in FIG. 4) using a carrier gas, e.g. air, which is provided to the spray nozzle arrangement 30 through the air inlet 50.

REFERENCE NUMERALS 1 transparent substrate (glass)
2 front contact
21 transparent conducting layer
22 high resistive buffer layer (ZTO layer)
221-223 partial ZTO layer
3 CdS layer
4 CdTe layer
5 back contact (metal)
10 substrate with base substrate as the top layer
20 substrate holder
20a heating element
30 spray nozzle arrangement
30a spray nozzle
40 solution inlet
50 air inlet

What is claimed is:

1. A method for forming a front contact in a CdTe (cadmium telluride) solar cell including a ZTO (zinc stannate) thin film with a concentration gradient and a transparent conducting layer, wherein the ZTO (zinc stannate) thin film is arranged between the transparent conducting layer and a CdS (cadmium sulfide) layer, the method comprising the steps:
   a) providing a base substrate, which is either the CdS (cadmium sulfide) layer or the transparent conducting layer, b) preparing an aqueous spray solution by mixing at least two precursor compounds comprising a Zn containing compound and a Sn containing compound, c) spraying the aqueous spray solution onto the base substrate thereby forming the ZTO (zinc stannate) thin film, and d) forming the transparent conducting layer on the ZTO (zinc stannate) thin film if the base substrate is the CdS (cadmium sulfide) layer, forming the CdS (cadmium sulfide) layer on the ZTO (zinc stannate) thin film if the base substrate is the transparent conducting layer;

wherein the ratio of the concentration of Zn and Sn in the aqueous spray solution is varied while performing the steps b) and c) such that the zinc concentration in the resulting ZTO (zinc stannate) thin film decreases from the interface with the CdS (cadmium sulfide) layer to the interface with the transparent conducting layer.

2. The method according to claim 1, characterized in that the ratio of the concentration of Zn and Sn within the aqueous spray solution is set to be in a range from 1 to 50.

3. The method according to claim 2, characterized in that one of the at least two precursor compounds is added continuously to the aqueous spray solution while performing the method.

4. The method according to claim 2, characterized in that step b) comprises at least two substeps b1) and b2), wherein a specific aqueous spray solution having a specific ratio of the concentration of Zn and Sn is prepared by mixing the at least two precursor compounds in each of the at least two substeps b1) and b2), and step c) comprises at least two substeps c1) and c2) each of them corresponding to one of the at least two substeps b1) and b2), wherein, in each of the at least two substeps c1) and c2), the specific aqueous spray solution prepared in the specific corresponding substep of step b) is sprayed onto the base substrate or onto a partial ZTO (zinc stannate) thin film formed in the previous substep of step c), respectively.

5. The method according to claim 1, characterized in that one of the at least two precursor compounds is added continuously to the aqueous spray solution while performing the method.

6. The method according to claim 1, characterized in that step b) comprises at least two substeps b1) and b2), wherein a specific aqueous spray solution having a specific ratio of the concentration of Zn and Sn is prepared by mixing the at least two precursor compounds in each of the at least two substeps b1) and b2), and step c) comprises at least two sub steps c1) and c2) each of them corresponding to one of the at least two substeps b1) and b2), wherein, in each of the at least two substeps c1) and c2), the specific aqueous spray solution prepared in the specific corresponding substep of step b) is sprayed onto the base substrate or onto a partial ZTO (zinc stannate) thin film formed in the previous substep of step c), respectively.

7. The method according to claim 6, characterized in that, in each of the at least two substeps c1) and c2), a specific partial ZTO (zinc stannate) thin film is formed with a thickness in a range of 10 nm to 50 nm.

8. The method according to claim 7, characterized in that, in each of the at least two substeps c1) and c2), a specific partial ZTO (zinc stannate) thin film is formed with a thickness in a range of 20 nm to 40 nm.

9. The method according to claim 1, characterized in that the base substrate is heated to a temperature in a range from 300° C. to 500° C. before spraying the aqueous spray solution onto the base substrate.

10. The method according to claim 9, characterized in that the base substrate is heated to a temperature in a range from 450° C. to 500° C., before spraying the aqueous spray solution onto it.

11. The method according to claim 1, characterized in that the ZTO (zinc stannate) thin film with a concentration gradient is formed with a thickness in a range from 20 nm to 1000 nm.

12. The method according to claim 1, characterized in that the ZTO (zinc stannate) thin film is formed with a thickness in a range from 20 nm to 150 nm.

13. The method according to claim 12, characterized in that the ZTO (zinc stannate) thin film is formed with a thickness in a range from 80 nm to 100 nm.

14. The method according to claim 1, characterized in that the Zn containing compound is $Zn(CH_3COO)_2 \cdot H_2O$ and in that the Sn containing compound is $SnCl_2H_2O$.

15. The method according to claim 1, characterized in that the transparent conducting oxide layer is a CTO layer with a concentration gradient or $SnO_2:F$.

16. The method according to claim 15, characterized in that the transparent conducting layer is a CTO layer with a concentration gradient and providing the transparent conducting layer in step a) or forming the transparent conducting layer in step d), respectively, comprises 30 preparing an aqueous spray solution by mixing at least two precursor compounds comprise a Cd containing compound and a Sn containing compound and spraying the aqueous spray solution onto a substrate or the ZTO (zinc stannate) thin film, respectively, wherein the ratio of the concentration of Cd and Sn within the aqueous spray solution is varied.

17. The method according to claim 16, characterized in that the Cd containing compound is $Cd(CH_3COO)_2 \cdot H_2O$ and in that the Sn containing compound is $SnCl_2 \cdot H_2O$.

18. The method according to claim 16, wherein the ratio of the concentration of Cd and Sn within the aqueous spray solution is varied during performing steps a) or d), respectively such that the cadmium concentration in the resulting CTO layer decreases over the whole CTO layer in a direction away from the interface of the CTO layer to the ZTO (zinc stannate) thin film.

19. The method according to anyone of claim 16, characterized in that the CTO layer is formed with a thickness in a range from 100 nm to 1000 nm.

20. The method according to claim 1, characterized in that hydrochloric acid is added to the aqueous spray solution in a volume percentage in a range from 0.5% to 10% of the whole volume of the prepared aqueous spray solution.

\* \* \* \* \*